United States Patent [19]

Eguchi et al.

[11] Patent Number: 4,806,432

[45] Date of Patent: Feb. 21, 1989

[54] COPPER-FOILED LAMINATED SHEET FOR FLEXIBLE PRINTED CIRCUIT BOARD

[75] Inventors: Yoshitugu Eguchi, Ibaraki; Masaru Miyashita, Tokyo; Hitoshi Arai, Ibaraki; Yoshimi Ogushi, Saitama, all of Japan

[73] Assignee: Shin-Etsu Chemical Co., Ltd., Tokyo, Japan

[21] Appl. No.: 928,396

[22] Filed: Nov. 10, 1986

[30] Foreign Application Priority Data

Nov. 21, 1985 [JP] Japan .................................. 60-261647
Nov. 21, 1985 [JP] Japan .................................. 60-261648

[51] Int. Cl.$^4$ ........................ B32B 15/08; B32B 27/36
[52] U.S. Cl. .................................... 428/457; 428/458; 428/901
[58] Field of Search ...................... 428/901, 458, 457; 156/313

[56] References Cited

U.S. PATENT DOCUMENTS

| | | | |
|---|---|---|---|
| 3,902,951 | 9/1975 | Doi et al. ............................ | 156/313 |
| 4,559,257 | 12/1985 | Nilsson ............................. | 428/458 X |
| 4,647,508 | 3/1987 | Mazit et al. ...................... | 428/901 X |

*Primary Examiner*—Thomas J. Herbert
*Attorney, Agent, or Firm*—Hopgood, Calimafde, Kalil, Blaustein & Judlowe

[57] ABSTRACT

The copper-foiled laminated sheet of the invention is used to prepare a printed circuit sheet having see-throughness after patterning by etching of the copper foil. Different from conventional copper-foiled laminates using an electrolytic copper foil having a surface roughness of 10 or larger, the inventive laminate is prepared using a rolled copper foil having a surface roughness of 1.5 to 5 so that the surface of the adhesive layer, from which the copper foil has been removed by etching, has no undue roughness as a replica of the copper foil surface not to irregularly diffuse the light giving a parallel light-beam transmission of at least 50% and overall light transmission of at least 70% to ensure good see-through visibility.

2 Claims, No Drawings

COPPER-FOILED LAMINATED SHEET FOR FLEXIBLE PRINTED CIRCUIT BOARD

BACKGROUND OF THE INVENTION

The present invention relaters to a copper-foiled laminated sheet for flexible printed circuit board as well as a flexible printed circuit board or sheet prepared thereof.

Along with the rapid development of electronic information-processing and communication instruments in recent years, many of the electric or electronic circuits used therein are formed in the form of a printed circuit board, which is prepared usually by the photolithographic techniques or screen printing followed by etching using a copper-foiled laminate as the base material. Such a copper-foiled laminate is a composite plate or sheet formed of an electrically insulating plate or sheet of a plastic resin such as polyethylene terephthalates and polyimides as the base to which a copper foil is adhesively bonded in lamination. In compliance with the demand for more and more compact and lighter and lighter instruments, many of the printed circuit boards or sheets are prepared using a thin and flexible laminated sheet as the material for the patterning process by partly removing the copper foil thereon by etching so that the remaining copper foil constitutes the desired electric circuit.

It is also highly desirable that the printed circuit board or sheet is see-through to such an extent that the assembly of the parts of an instrument or a display below the circuit sheet is visible as completely as possible through the printed circuit sheet above it. This requirement can of course be satisfied by using a plastic-made base sheet or film as highly transparent as possible and by removing the copper foil as widely as possible to leave only a small area of the copper foil.

Commercially available copper foils include those manufactured by an electrolytic process and those manufactured by rolling. Elec-rolytic copper foils usually have a relatively rough surface with good receptivity of an adhesive so that they can be used as such for the adhesive bonding with the insulating base film of plastics. Rolled copper foils, on the other hand, usually have a smooth surface with poor receptivity of an adhesive so that they cannot be used practically for the manufacture of copper-foiled laminated sheets despite their relative inexpensiveness unless the surface thereof is subjected to a roughening treatment prior to adhesive bonding with a plastic film. At any rate, it is important that the surface of the copper foil to be adhesively bonded with the plastic film should have an adequate surface roughness of, for example, at least 10 according to the standard specified in JIS B 0601.

The use of such a surface-roughened copper foil in the preparation of a copper-foiled laminated sheet has a problem in respect of the see-throughness of the flexible printed circuit sheet manufactured thereof. Namely, when a part of the copper foil on the laminated sheet has been removed by the process of etching to construct an electric circuit, the surface of the layer of the adhesive which formerly is in service for bonding of the plastic film and the copper foil is now exposed bare while the surface of the adhesive layer is not smooth enough but in a condition with ruggedness which is a replica of the rough surface of the copper foil having been removed by etching. Needless to say, such a surface condition with roughness is very detrimental when high see-throughness or transparency is desired of the sheet or film because the light transmitting the sheet or film like a frosted window pane is irregularly diffused at the roughened surface so that the bodies below the film or sheet are hardly visible therethrough. The see-throughness of a film or sheet is determined by the % transmission of parallel light beams as defined in JIS K 6714. In other words, the parallel light-beam transmission is a determinant factor of see-throughness along with the overall light transmission. In this connection, it is not rare that the parallel light-beam transmission through the areas of a flexible printed circuit sheet from which the copper foil has been removed by etching is 20% or less. It is of course that such a film or sheet having the parallel light-beam transmission so low can hardly satisfy the requirement that the flexible printed circuit sheet should be highly see-through.

SUMMARY OF THE INVENTION

It is therefore an object of the present invention to provide a copper-foiled laminated sheet capable of giving a flexible printed circuit sheet having see-throughness so high as not to be obtained in conventional copper-foiled laminated sheets.

Thus, the copper-foiled laminated sheet for flexible printed circuit sheet of the present invention comprises a flexible and transparent base film of an electrically insulating plastic resin, a layer of an adhesive and a rolled copper foil adhesively bonded to the base film with the layer of the adhesive intervening therebetween, the surface of the copper foil adhesively bonded to the base film having a surface roughness in the range from 1.5 to 5 according to the standard specified in JIS B 0601, so that the base film bearing the layer of the adhesive after removing the copper foil by etching has a parallel light-beam transmission of at least 50% or, preferably, at least 60% and an overall light transmission of at least 70% or, preferably, at least 80%.

DETAILED DESCRIPTION OF THE PREFERRED EMBODIMENTS

As is understood from the above given summary of the invention, the copper-foiled laminated sheet of the invention is composed of a flexible and transparent base film of an electrically insulating plastic resin and a rolled copper foil adhesively bonded together in lamination by use of an adhesive. The base film should be transparent as highly as possible with a light transmission of, desirably, at least 85%. The plastic resin is not particularly limitative provided that the film thereof has flexibility and sufficiently high light transmission including polyethylene terephthalates, polyether ether ketones, polyether sulfones, polycarbonates and the like, of which polyethylene terephthalates are preferred.

Although the above mentioned plastic films can be used as such for the bonding works with a copper foil, it is preferable that the surface of the plastic film is subjected to a treatment prior to adhesive bonding with an object to improve the receptivity of adhesives. Various methods have been proposed for the surface treatment of plastic films, of which the treatment with low temperature plasma is preferred in respect of the efficiency of surface improvements.

The low temperature plasma treatment of the plastic film can be performed by holding the film in or by continuously transferring the film through a plasma chamber for the generation of low temperature plasma and, while the atmosphere inside the plasma chamber is kept and controlled at a reduced pressure of 0.01 to 10 Torr by the balance of continuous introduction of an inorganic gas and continuous evacuation, and by impressing a high-frequency electric power at a frequency of 10 kHz to 100 MHz between the electrodes. The frequency band of the electric power impression is not limited to the above mentioned high-frequency range but can be direct current, low frequencies or micro waves. The transparency and mechanical strength of the plastic film are little affected by this low temperature plasma treatment.

The copper foil to be adhesively bonded to the above mentioned plastic film should be a rolled copper foil and should have a thickness in the range from 17 to 35 μm and a surface roughness, i.e. a value of the true surface area divided by the apparent geometrical surface area, of 1.5 to 5.0 or, preferably, 1.5 to 3. When the surface roughness is higher than 5.0, the transparency of the printed circuit sheet is decreased on the atras from which the copper foil has been removed by etching. A copper foil having a surface roughness lower than 1.5 can be manufactured hardly by the process of rolling. The adhesive used for bonding the copper foil and the base film of a plastic resin should also be colorless and have transparency. Thermosetting or thermally curable adhesives are preferred to thermoplastic ones and exemplified by thermally curable polyester-based and acrylic adhesives, The flexible copper-foiled laminated sheet of the invention can be manufactured by a process in which the base film of a plastic resin, optionally after a low temperature plasma treatment, is coated on one of the surfaces with an adhesive followed by drying and then a copper foil is overlaid thereon and press-bonded by passing through hot rollers.

The thus prepared copper-foiled laminated sheet is flexible with high adhesive bonding strength between the base film and the copper foil so that it is quite satisfactory as a base material for flexible printed circuit board or sheet. Namely, the copper foil can be patterned by the techniques of photolithography or screen printing followed by etching into a pattern of a desired electric circuit. The area of the sheet from which the copper foil has been removed by etching is highly see-through with a parallel light-beam transmission of at least 50% or, if desired, at least 60% and overall light transmission of at least 70% or, if desired, at least 80% so that the printed circuit sheet prepared using the same can be advantageously mounted on various electronic instruments in respect of the see-throughness giving a possibility of directly inspecting or watching the parts or display below therethrough.

Such an advantage given by the see-throughness of the printed cicuit sheet naturally depends on the density of the copper foil left unremoved on the base film after etching to form an electric circuit to ensure higher visibility therethrough as the portion of the copper foil removed by etching is increased. In this regard, quite satisfactory see-through visibility can be ensured with the inventive flexible copper-foiled laminated sheet when the area of the copper foil unremoved by etching to form the circuit does not exceed 30% of the overall area of the printed circuit sheet or a space ratio of at least 70% assuming a relatively evenly distributed circuit pattern so that the flexible printed circuit sheet can be used by mounting even on or in front of a display such as CRTs and LDs. In this connection, it is also desirable that the line width of the circuit formed by the copper foil on the base film does not exceed a half of the width of the space between the adjacent circuit lines and the width of the line spaces is 1.0 mm or larger allover the surface of the printed circuit sheet.

In the following, the flexible copper-foiled laminated sheet of the invention is described in more detail by way of examples.

EXAMPLE 1.

A polyethylene terephthalate film having a thickness of 100 μm was uniformly coated with an acrylate-based thermally curable adhesive in such a thickness that the thickness of the adhesive layer after drying and curing should be 20 μm and dried. Then, a rolled copper foil having a surface roughness of 3 was overlaid thereon and bonded by pressing at 120° C. for 40° minutes under a pressure of 50 kg/cm2 to give a copper-foiled laminated sheet. The adhesive bonding strength or peeling resistance of the base film and the copper foil was 0.8 kg/cm, which was satisfactorily high as a material for the manufacture of printed circuit sheets.

The copper-foiled laminate was subjected to whole-surface etch-ng to completely remove the copper foil and the light transmission through the thus obtained base film coated with the adhesive layer was examined to find that the parallel light-beam transmission was 79% and the overall light transmission was 90%.

EXAMPLE 2.

The same polyethylene terephthalate film as used in Example 1 was first subjected to a treatment with low temperature plasma of an inorganic gas and then uniformly coated with a polyester-based thermally curable adhesive in such a thickness that the adhesive layer after drying should have a thickness of 15 μm and dried. Then a rolled copper foil having a thickness of 35 μm and surface roughness of 3 was bonded thereto by pressing at 120° C. for 40 minutes under a pressure of 50 kg/cm2 to give a copper-foiled flexible laminated sheet. Despite the flexibility of the laminate, the peeling resistance between the base film and the copper foil was as high as 1.5 kg/cm by virtue of the low temperature plasma treatment beforehand. The laminate was also highly resistant against chemicals and solvents used in the process of patterning into a printed circuit sheet The copper-foiled laminate was subjected to whole-surface etching to completely remove the copper foil. The condition of the surface after removal of the copper foil was a substantial replica of the surface of the copper foil. The light transmission through the thus obtained base film coated with the adhesive layer was examined to find that the parallel light-beam transmission was 80% and the overall light transmission was 88%.

The copper-foiled laminate was subjected to patterning of the copper foil by a photolithographic techniques into a latticewise line-and-space pattern having a line width of 100 μm and space width of 500 μm and the light transmission therethrough was examined to find that the parallel light-beam transmission was 65% and overall light transmission was 80% to ensure good see-through visibility of the images below it.

EXAMPLE 3.

A continuous-length copper-foiled laminated sheet was prepared using a continuous laminating machine from the same polyethylene terephthalate film, polyester-based thermally-curable adhesive and copper foil as used in the preceding example. the thickness of the adhesive layer was 15 μm as dried and the temperature of the heating rollers was set at 120° C.

The copper foil of the thus prepared laminate was patterned by the techniques of screen printing with a resist ink followed by etching into a lattice-wise line-and-space pattern having a line width of 50 μm and a space width of 500 μm corresponding to a space ratio of 83%. The thus patterned laminate was examined for the light transmission to find that the parallel light-beam transmission was 85% and the overall light transmission was 65 % to be sufficient to ensure good see-through visibility therethrough.

Comparative Example

The experimental procedure was substantially the same as in Example 3 except that the rolled copper foil having a surface roughness of 3 was replaced with an electrolytic copper foil having a thickness of 18 μm and surface roughness of about 10. The laminated sheet after patterning was examined for the light transmission to find that the parallel light-beam transmission was about 40% and the overall light transmission was about 85%.

What is claimed is:

1. A copper-foiled laminated sheet for flexible printed circuit sheet which comprises a flexible and transparent base film of an electrically insulating plastic resin, a layer of an adhesive and a rolled copper foil adhesively bonded to the base film with the layer of the adhesive intervening therebetween, the surface of the copper foil adhesively bonded to the base film having a surface that has been subjected to a treatment with low temperature plasma of an inorganic gas prior to adhesive bonding with the copper foil and having a surface roughness in the range from 1.5 to 5 according to the standard specified in JIS B 0601 and the laminated sheet, after the copper foil has been removed by etching, having at least a 60% parallel light beam transmission.

2. The copper-foiled laminated sheet for flexible printed circuit sheet as claimed in claim 1 wherein the adhesive is thermally curable.

* * * * *